(12) United States Patent
Somada

(10) Patent No.: US 10,707,172 B2
(45) Date of Patent: Jul. 7, 2020

(54) COMPONENT-EMBEDDED SUBSTRATE, METHOD OF MANUFACTURING THE SAME, AND HIGH-FREQUENCY MODULE

(71) Applicant: Murata Manufacturing Co., Ltd., Nagaokakyo-shi, Kyoto-fu (JP)

(72) Inventor: Hiroshi Somada, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 46 days.

(21) Appl. No.: 16/212,750

(22) Filed: Dec. 7, 2018

(65) Prior Publication Data

US 2019/0109091 A1    Apr. 11, 2019

Related U.S. Application Data

(63) Continuation of application No. PCT/JP2017/020382, filed on Jun. 1, 2017.

(30) Foreign Application Priority Data

Jun. 29, 2016   (JP) ................................. 2016-128673

(51) Int. Cl.
*H01L 21/00* (2006.01)
*H01L 23/538* (2006.01)
(Continued)

(52) U.S. Cl.
CPC ........ *H01L 23/5389* (2013.01); *H01L 21/486* (2013.01); *H01L 21/4853* (2013.01);
(Continued)

(58) Field of Classification Search
CPC . H01L 2924/16225; H01L 2224/73265; H01L 23/49827; H01L 21/486;
(Continued)

(56) References Cited

U.S. PATENT DOCUMENTS 6,512,182 B2 * 1/2003 Takeuchi ............... H01L 21/568
174/255
8,546,842 B2 * 10/2013 Higuma ................ H01L 33/641
257/100
(Continued)

FOREIGN PATENT DOCUMENTS

JP    2001-244638 A    9/2001
JP    2006-114621 A    4/2006
(Continued)

OTHER PUBLICATIONS

Official Communication issued in International Patent Application No. PCT/JP2017/020382, dated Jul. 25, 2017.

*Primary Examiner* — S. V. Clark
(74) *Attorney, Agent, or Firm* — Keating & Bennett, LLP

(57) ABSTRACT

A method of manufacturing a component-embedded substrate includes a resist forming step in which a patterning resist is formed on a support, a patterning step in which a through hole extending through the resist is formed by performing patterning on the resist, a first-electrode forming step in which a through-via electrode is formed by filling the through hole with an electrode material, a resist removing step in which the resist is removed, a component placement step in which an electronic component is placed, a substrate forming step in which a resin substrate is formed by sealing the electronic component with a resin that includes a filler having a diameter larger than the surface roughness of a side surface of the through-via electrode, and a removing step in which the support is removed from the resin substrate. The first-electrode forming step is performed before the substrate forming step is performed.

18 Claims, 5 Drawing Sheets

(51) Int. Cl.
*H05K 1/18* (2006.01)
*H05K 3/42* (2006.01)
*H01L 21/48* (2006.01)
*H01L 21/56* (2006.01)
*H01L 23/29* (2006.01)
*H01L 23/31* (2006.01)
*H01L 23/60* (2006.01)
*H01L 23/66* (2006.01)
*H01L 23/00* (2006.01)
*H01L 25/10* (2006.01)
*H01L 25/00* (2006.01)
*H05K 3/46* (2006.01)
*H05K 3/00* (2006.01)

(52) U.S. Cl.
CPC .......... *H01L 21/565* (2013.01); *H01L 21/568* (2013.01); *H01L 23/295* (2013.01); *H01L 23/3107* (2013.01); *H01L 23/5384* (2013.01); *H01L 23/5386* (2013.01); *H01L 23/60* (2013.01); *H01L 23/66* (2013.01); *H01L 24/19* (2013.01); *H01L 24/20* (2013.01); *H01L 25/105* (2013.01); *H01L 25/50* (2013.01); *H05K 1/185* (2013.01); *H05K 3/423* (2013.01); *H01L 2223/6616* (2013.01); *H01L 2224/04105* (2013.01); *H01L 2224/131* (2013.01); *H01L 2224/16235* (2013.01); *H01L 2224/214* (2013.01); *H01L 2224/96* (2013.01); *H01L 2225/1035* (2013.01); *H01L 2225/1058* (2013.01); *H01L 2924/142* (2013.01); *H01L 2924/15313* (2013.01); *H05K 3/007* (2013.01); *H05K 3/4647* (2013.01); *H05K 2201/10515* (2013.01); *H05K 2203/0733* (2013.01); *H05K 2203/308* (2013.01)

(58) Field of Classification Search
CPC . H01L 2224/05568; H01L 2224/29499; H01L 23/295; H01L 23/481; H01L 33/52
USPC .......................... 438/125, 126, 127; 257/787
See application file for complete search history.

(56) References Cited

U.S. PATENT DOCUMENTS

| | | |
|---|---|---|
| 2008/0189942 A1 | 8/2008 | Kim et al. |
| 2008/0263860 A1 | 10/2008 | Mok et al. |
| 2010/0027225 A1 | 2/2010 | Yuda et al. |
| 2014/0170815 A1* | 6/2014 | Jeong ............... H01L 23/5389 438/125 |
| 2014/0290997 A1* | 10/2014 | Maeda ............. H01L 23/49822 174/258 |
| 2015/0145145 A1* | 5/2015 | Tsuyutani ............... H01L 24/05 257/774 |
| 2015/0371916 A1* | 12/2015 | Barr ..................... H01L 23/295 438/127 |
| 2016/0020171 A1* | 1/2016 | Lim ..................... H01L 21/561 257/774 |
| 2016/0073499 A1 | 3/2016 | Ogawa et al. |
| 2016/0126126 A1* | 5/2016 | Chen .................. H01L 21/6835 257/738 |
| 2016/0351543 A1 | 12/2016 | Ryu et al. |
| 2018/0005920 A1* | 1/2018 | Kajihara ................ H01L 23/36 |

FOREIGN PATENT DOCUMENTS

| | | |
|---|---|---|
| JP | 2008-277750 A | 11/2008 |
| WO | 2008/136251 A1 | 11/2008 |
| WO | 2009/072482 A1 | 6/2009 |
| WO | 2010/150522 A1 | 12/2010 |
| WO | 2014/188760 A1 | 11/2014 |
| WO | 2015/119396 A1 | 8/2015 |

* cited by examiner

COMPONENT-EMBEDDED SUBSTRATE, METHOD OF MANUFACTURING THE SAME, AND HIGH-FREQUENCY MODULE

CROSS REFERENCE TO RELATED APPLICATIONS

This application claims the benefit of priority to Japanese Patent Application No. 2016-128673 filed on Jun. 29, 2016 and is a Continuation Application of PCT Application No. PCT/JP2017/020382 filed on Jun. 1, 2017. The entire contents of each application are hereby incorporated herein by reference.

BACKGROUND OF THE INVENTION

1. Field of the Invention

The present invention relates to a component-embedded substrate, a method of manufacturing the component-embedded substrate, and a high-frequency module.

2. Description of the Related Art

Electronic components are often mounted on printed circuit boards in a planar manner. In recent years, with the reduction in the sizes and the increase in the functionalities of electronic devices, it has been necessary to densely arrange electronic components onto printed circuit boards. Accordingly, in order to realize such a dense arrangement of electronic components, there has been proposed a technology for three-dimensionally mounting electronic components. For example, Japanese Unexamined Patent Application Publication No. 2001-244638 discloses a component-embedded substrate that enables an electronic component to be three-dimensionally mounted thereon.

As disclosed in Japanese Unexamined Patent Application Publication No. 2001-244638, a component-embedded substrate often has a through-via electrode formed so as to extend therethrough. Such a through-via electrode is used for connecting an electronic component mounted on a component-embedded substrate to a wiring line on a printed circuit board through the component-embedded substrate. A through-via electrode is generally formed by forming a through hole in a resin substrate, which is included in a component-embedded substrate, and then filling the through hole with an electrode material. A resin that is used to form a resin substrate contains a filler made of a hard material, such as a silicon oxide, in order to make the coefficient of linear expansion of the resin substrate uniform.

In general, in the case of sealing an electronic component with a resin that includes a large-diameter filler, the surface area of the filler with respect to a resin component included in the resin is smaller than that in the case of using a resin that includes a small-diameter filler. Thus, the fluidity of the resin is improved, and the filling property of the resin can be improved.

However, in a method of the related art for forming a through-via electrode in a component-embedded substrate, the surface roughness of a side surface (a surface that is in contact with a resin substrate) of a through-via electrode depends on a diameter of a filler included in a resin. Thus, in the case where an electronic component is sealed with a resin that includes a filler having a larger diameter, there is a problem in that the surface roughness of the through-via electrode increases, which in turn results in degradation of high-frequency characteristics.

The reason why the surface roughness of a through-via electrode becomes large in the case of using a method of the related art and a problem due to a large surface roughness of a through-via electrode will be described below.

Although a through hole is often formed in a resin substrate by using laser, it is difficult to partially scrape off a filler by using laser. Thus, a filler that is exposed at an inner surface of a through hole when the through hole is formed remains in a state of protruding from the inner surface or is desorbed from the inner surface resulting in formation of dents (filler marks). Consequently, depressions and projections due to the filler are formed in and on the inner surface of the through hole. Therefore, similar to the inner surface of the through hole, depressions and projections are formed in and on a side surface of a through-via electrode that is formed by filling the through hole with an electrode material.

When a current in a high frequency range flows through the through-via electrode, the current flows through a surface layer portion of the through-via electrode including the side surface of the through-via electrode. Consequently, when the surface roughness of the side surface of the through-via electrode is large, the flow of the current in the through-via electrode is obstructed, and as a result, the resistance of the through-via electrode increases. Thus, when the component-embedded substrate is applied to a high-frequency module, the large surface roughness of the side surface of the through-via electrode causes degradation of high-frequency characteristics.

SUMMARY OF THE INVENTION

Accordingly, preferred embodiments of the present invention provide component-embedded substrates in each of which a surface roughness of a side surface of a through-via electrode is small while a filling property of a resin is improved, and also provide methods of manufacturing the component-embedded substrate, and high-frequency modules.

A method of manufacturing a component-embedded substrate according to a preferred embodiment of the present invention includes a resist forming step, a patterning step, a first-electrode forming step, a resist removing step, a component placement step, a substrate forming step, and a removing step. In the resist forming step, a patterning resist is formed onto a support. In the patterning step, a through hole extending through the resist is formed by performing patterning on the resist. In the first-electrode forming step, a through-via electrode is formed by filling the through hole with an electrode material. In the resist removing step, the resist is removed, and in the component placement step, an electronic component is placed. In the substrate forming step, a resin substrate is formed by sealing the electronic component with a resin that includes a filler having a diameter larger than a surface roughness of a side surface of the through-via electrode. In the removing step, the support is removed from the resin substrate. In the manufacturing method, the first-electrode forming step is performed before the substrate forming step is performed.

The patterning resist that is formed by a photolithography technique does not include a filler such as that generally included in a sealing resin and is designed such that the resist has a smooth surface. Thus, depressions and projections due to a filler are not formed in and on an inner surface of the through holes formed in the resist, and the inner surface is smooth. Therefore, similar to the inner surface of the through hole, the side surface of the through-via electrode, which is formed by filling the through hole with the electrode material, is smooth with less depressions and projections.

In a method of manufacturing a component-embedded substrate according to a preferred embodiment of the present invention, it is preferable that the resist forming step include a step of causing the support to support a base conductor and a step of forming the patterning resist onto the base conductor. In this case, in the patterning step, a surface of the base conductor is exposed by forming the through hole. In the component placement step, the electronic component is disposed on the base conductor. In the substrate forming step, the resin substrate is formed on the base conductor. In the removing step, the base conductor remains on the resin substrate when the support is removed from the resin substrate. In such a method, it is preferable to further perform a conductor removing step of removing the base conductor from the resin substrate after the removing step has been performed.

According to the method, in the first-electrode forming step, the through-via electrode is able to be formed by electrolytic plating such as filling plating while the base conductor is used as a plating electrode. In addition, in the removing step, by leaving the base conductor on the resin substrate, static electricity that may be generated when the support is removed from the resin substrate is able to escape to the outside through the base conductor. Therefore, the electronic component is prevented from being damaged by electrostatic discharge in the removing step.

In a method of manufacturing a component-embedded substrate according to a preferred embodiment of the present invention, it is preferable that the base conductor be chemically removed from the resin substrate in the conductor removing step. According to this method, the base conductor is able to be removed without generating static electricity. Therefore, the electronic component is able to be prevented from being damaged by electrostatic discharge in the conductor removing step.

In a method of manufacturing a component-embedded substrate according to a preferred embodiment of the present invention, it is preferable that the electronic component be resin-sealed by using the resin including the filler in the substrate forming step. According to the method, the coefficient of linear expansion of the resin substrate is able to be made uniform, and as a result, the reliability of the component-embedded substrate that is manufactured is improved.

In a method of manufacturing a component-embedded substrate according to a preferred embodiment of the present invention, it is preferable to further perform a second-electrode forming step of forming, after the removing step has been performed, a wiring electrode that connects a terminal of the electronic component and the through-via electrode to each other onto a main surface of the resin substrate, the main surface being located on a side on which the support is disposed. According to the component-embedded substrate that is manufactured by the method, when another electronic component is mounted on the component-embedded substrate, the other electronic component is able to be connected to the electronic component embedded in the component-embedded substrate.

A component-embedded substrate according to a preferred embodiment of the present invention includes a resin substrate, an electronic component that is embedded in the resin substrate, a through-via electrode, and a wiring electrode. The resin substrate is defined by a resin including a filler, and the through-via electrode extends through the resin substrate. The wiring electrode is an electrode that is provided on at least one of main surfaces of the resin substrate and connects a terminal of the electronic component and the through-via electrode to each other. A surface roughness of a surface of the through-via electrode, the surface being in contact with the resin substrate, is smaller than a diameter of the filler.

According to the above-described component-embedded substrate, the side surface of the through-via electrode is smooth with less depressions and projections.

In a component-embedded substrate according to a preferred embodiment of the present invention, the surface roughness of the surface of the through-via electrode, which is in contact with the resin substrate, may be Rp.

In a component-embedded substrate according to a preferred embodiment of the present invention, the diameter of the filler as referred to herein, is a largest diameter among diameters of filler particles included in the resin.

In a component-embedded substrate according to a preferred embodiment of the present invention, a distance between the through electrode and the electronic component may be larger than a sum of the surface roughness of the surface of the through-via electrode, which is in contact with the resin substrate, and the diameter of the filler.

According to the above-described component-embedded substrate, the filling percentage of the resin is able to be further increased.

In a component-embedded substrate according to a preferred embodiment of the present invention, the through electrode may include a first through electrode and a second through electrode, and a distance between the first through electrode and the second through electrode may be larger than a sum of a surface roughness of a surface of the first through-via electrode, the surface being in contact with the resin substrate, a surface roughness of a surface of the second through-via electrode, the surface being in contact with the resin substrate, and the diameter of the filler.

According to the above-described component-embedded substrate, the filling percentage of the resin is able to be further increased.

A high-frequency module according to a preferred embodiment of the present invention includes the above-described component-embedded substrate and another electronic component. The other electronic component is mounted on one of main surfaces of the resin substrate, which is included in the component-embedded substrate, and is connected to the through-via electrode on the one main surface.

According to the high-frequency modules, the surface roughness of the side surface of the through-via electrode is small, and thus, favorable frequency characteristics are obtained.

Component-embedded substrates, methods of manufacturing the component-embedded substrates, and high-frequency modules according to preferred embodiments of the present invention achieve reduced surface roughness of a side surface of a through-via electrode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
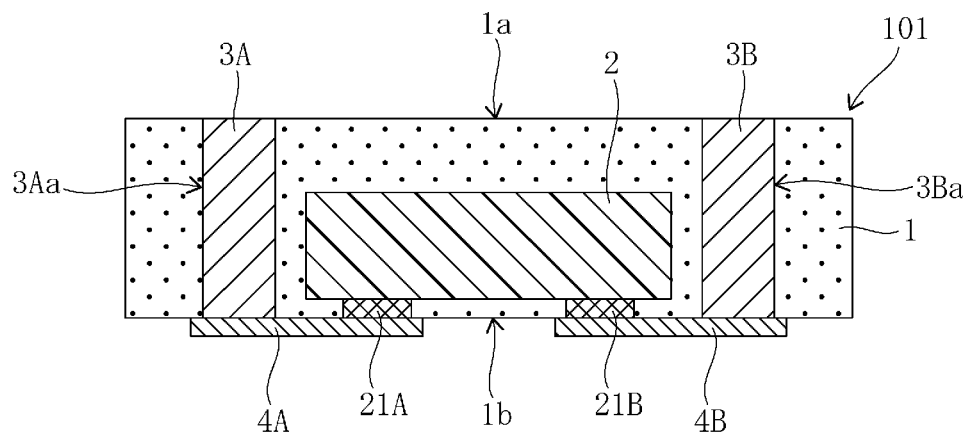
FIG. 1 is a sectional view conceptually illustrating a component-embedded substrate according to a preferred embodiment of the present invention.

FIG. 1 is a sectional view conceptually illustrating a component-embedded substrate 101 according to a preferred embodiment of the present invention. As illustrated in FIG. 1, the component-embedded substrate 101 includes a resin substrate 1, an electronic component 2, through-via electrodes 3A and 3B, and wiring electrodes 4A and 4B.

The resin substrate 1 is a substrate made of a resin that includes a filler made of a hard material, such as a silicon oxide, and includes a first main surface 1a and a second main surface 1b that are located on opposite sides. Note that the resin substrate 1 includes a filler having a diameter larger than the surface roughness of a side surface of each of the through-via electrodes 3A and 3B, which will be described later. As a result, the surface area of the filler with respect to a resin component included in the resin is smaller than that in the case where the diameter of the filler is small, and thus, the fluidity of the resin is improved, and the filling property of the resin is improved.

The electronic component 2 is, for example, a high-frequency device and is embedded in the resin substrate 1. In the present preferred embodiment, the electronic component 2 includes two terminals 21A and 21B, and the terminals 21A and 21B are exposed at the second main surface 1b of the resin substrate 1. Note that the terminals of the electronic component 2 that are exposed at the second main surface 1b are not limited to being two terminals and may be one terminal or three or more terminals.

The through-via electrodes 3A and 3B extend through the resin substrate 1 from the first main surface 1a to the second main surface 1b at positions located on opposite sides with the electronic component 2 interposed therebetween. Note that the number and position of the through-via electrodes provided in the resin substrate 1 may be suitably changed in accordance with, for example, the number of the terminals of the electronic component 2 that are exposed at the second main surface 1b or the number of terminals of an electronic component 102 (see FIG. 2) mounted on the first main surface 1a. In addition, the through-via electrodes are not limited to being two through-via electrodes and may be one through-via electrode or three or more through-via electrodes.

In the present preferred embodiment, a parameter P1 that represents the surface roughness of a side surface 3Aa (a surface that is in contact with the resin substrate 1) of the through-via electrodes 3A and the surface roughness of a side surface 3Ba (a surface that is in contact with the resin substrate 1) of the through-via electrode 3B is smaller than a parameter P2 that represents a diameter of the filler included in the resin that the resin substrate 1 is made of. As used herein, the diameter of the filler included in the resin is a largest diameter among diameters of filler particles included in the resin. As a non-limiting example, the parameter P1 is a value measured by using a length measurement function of a microscope and preferably is about 1 μm to about 3 μm, for example. The parameter P2 is a value measured by a similar method and preferably is about 2 μm to about 20 μm, for example.

The wiring electrodes 4A and 4B are planar electrodes in regions of the second main surface 1b, the regions being spaced apart from each other. In the present preferred embodiment, the wiring electrode 4A connects the terminal 21A of the electronic component 2 and the through-via electrode 3A to each other on the second main surface 1b, and the wiring electrode 4B connects the terminal 21B of the electronic component 2 and the through-via electrode 3B to each other on the second main surface 1b.

Note that the position and number of the wiring electrodes provided on the second main surface 1b may be suitably changed in accordance with, for example, the position and number of the terminals of the electronic component 2 that are exposed at the second main surface 1b or the position and number of the through-via electrodes provided in the resin substrate 1. In addition, the wiring electrodes are not limited to being two wiring electrodes and may be one wiring electrode or three or more wiring electrodes. Furthermore, the wiring electrodes are not limited to connecting the terminals of the electronic component 2 and the through-via electrodes to each other, and the wiring electrodes may be connected only to either the terminals or the through-via electrodes.

Figure 2:
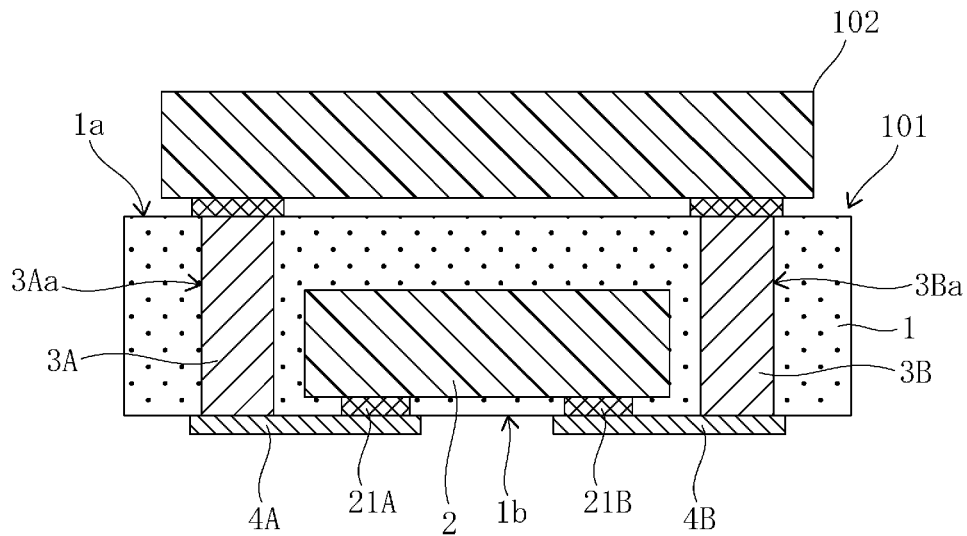
FIG. 2 is a sectional view conceptually illustrating a high-frequency module according to a preferred embodiment of the present invention.

FIG. 2 is a sectional view conceptually illustrating a high-frequency module according to the present preferred embodiment of the present invention. As illustrated in FIG. 2, the high-frequency module can be formed by mounting the electronic component 102 onto the above-described component-embedded substrate 101. More specifically, the electronic component 102 is mounted on the first main surface 1a of the resin substrate 1, and at the first main surface 1a, the electronic component 102 is connected to the through-via electrodes 3A and 3B with solder or the like.

When the above-described component-embedded substrate 101 is manufactured, a resist forming step, a patterning step, a first-electrode forming step, a resist removing step, a component placement step, a substrate forming step, a removing step, a conductor removing step, and a second-electrode forming step are sequentially performed. FIGS. 3A to 3C, FIGS. 4A to 4C, and FIGS. 5A to 5C are diagrams sequentially illustrating these steps.

Figure 3A:
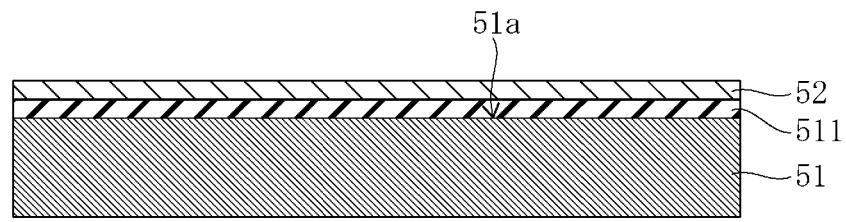
FIGS. 3A to 3C are diagrams sequentially illustrating steps that are performed when a component-embedded substrate is manufactured.

The resist forming step preferably includes first and second steps, for example. In the first step, a support 51 including a flat surface 51a and a metal film 52 are prepared. Then, as illustrated in FIG. 3A, the metal film 52 is attached to the flat surface 51a of the support 51 so as to be supported on the support 51.

A substrate such as, for example, a printed circuit board or a silicon substrate that has suitable rigidity is used to form the support 51. For example, a copper foil is used to form the metal film 52. An adhesive member 511, such as a double-sided adhesive tape, that is capable of being peeled off from the support 51 and the metal film 52 is used to attach the metal film 52.

Note that the film that is attached to the flat surface 51a of the support 51 is not limited to the metal film 52 such as a copper foil, and any one of various thin films (including sheets and plate-shaped members) that have electrical conductivity may be attached to the flat surface 51a of the support 51. Such various thin films including the metal film 52 each correspond to a base conductor.

Figure 3B:
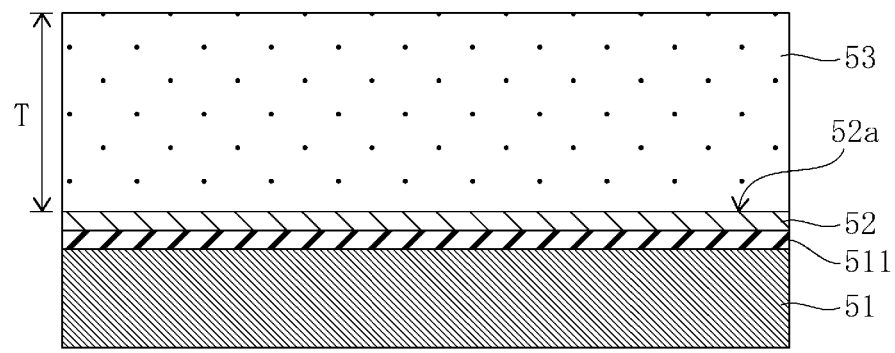

In the second step, as illustrated in FIG. 3B, a patterning resist 53 is formed on a surface 52a (a flat surface that is located on the side opposite to the side on which the support 51 is disposed) of the metal film 52. In this case, the resist 53 is formed so as to have a predetermined thickness T that corresponds to the lengths of the through-via electrodes 3A and 3B to be formed in the component-embedded substrate 101. For example, a solder resist is used to form the patterning resist 53.

Figure 3C:
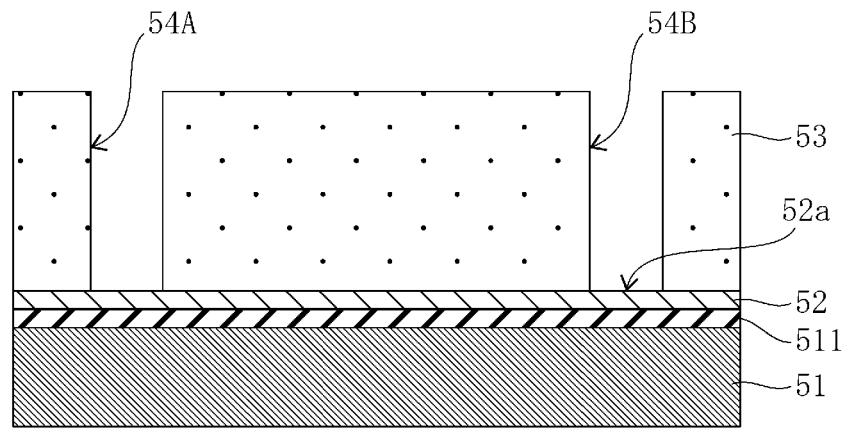

In the patterning step, as illustrated in FIG. 3C, patterning is performed on the resist 53 so as to form through holes 54A and 54B each extending through the resist 53. As a result, the surface 52a of the metal film 52 is exposed. As an example, the patterning is performed by using a photolithography technique.

The through holes 54A and 54B correspond to the through-via electrodes 3A and 3B to be formed, respectively. Regarding the positions at which the through holes 54A and 54B are formed, high accuracy is not required for the absolute positions of the through holes 54A and 54B in the resist 53 as long as the relative positional relationship between the through holes 54A and 54B is maintained with high accuracy. In other words, when the through holes 54A and 54B are formed, even if the positions at which the through holes 54A and 54B have been actually formed deviate from target positions, this deviation is acceptable as long as the positions deviate from the corresponding target positions by the same distance in the same direction. This is because, unlike a manufacturing method of the related art, the arrangement (positioning) of the electronic component 2, which will be described later, is performed after the through-via electrodes 3A and 3B have been formed.

The patterning resist 53 that is formed by using a photolithography technique does not include a filler such as that generally included in a sealing resin and is designed such that the formed resist 53 has a smooth surface. Thus, depressions and projections due to a filler are not formed in and on the inner surfaces of the through holes 54A and 54B formed in the resist 53, and the inner surfaces are smooth. As described above, in order to reduce the surface roughness of each of the side surfaces 3Aa and 3Ba of the through-via electrodes 3A and 3B, it is important to form the through holes 54A and 54B for the through-via electrodes 3A and 3B by using the resist 53 before the resin substrate 1 including the filler is formed (i.e., before the substrate forming step, which will be described later, is performed).

Figure 4A:
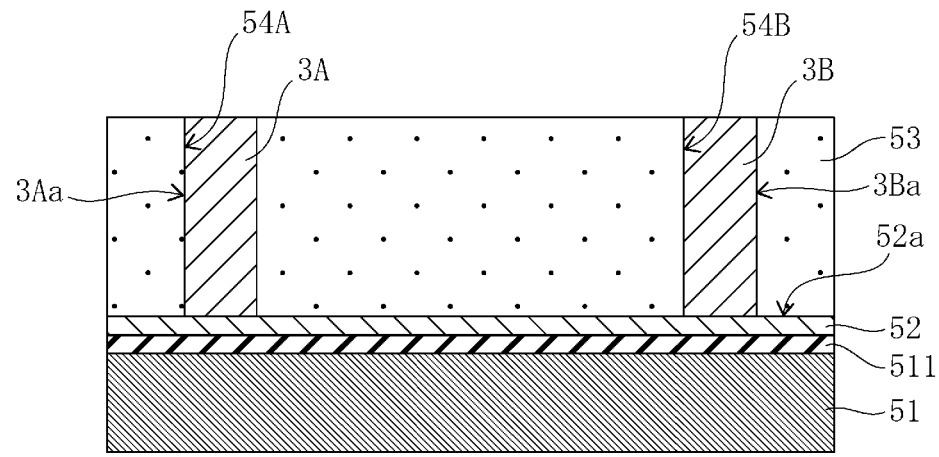
FIGS. 4A to 4C are diagrams sequentially illustrating, following FIG. 3C, steps that are performed when a component-embedded substrate is manufactured.

In the first-electrode forming step, as illustrated in FIG. 4A, the through holes 54A and 54B are filled with an electrode material, so that the through-via electrodes 3A and 3B are formed. As an example, the through holes 54A and 54B are filled with the electrode material by electrolytic plating such as filling plating. In this case, the metal film 52 is used as a plating electrode. A material, such as copper (Cu), nickel (Ni), tin (Sn), or gold (Au), that has a high conductivity is used as the electrode material.

An electrode that is formed by plating in the manner described above grows along a patterned resist, and thus, similar to the inner surfaces of the through holes 54A and 54B, the side surfaces 3Aa and 3Ba of the through-via electrodes 3A and 3B are smooth with less depressions and projections. As a result, in the component-embedded substrate 101 that is manufactured, the surface roughness of each of the side surfaces 3Aa and 3Ba of the through-via electrodes 3A and 3B is small. In this manner, the first-electrode forming step, in which in which the through holes 54A and 54B are filled with the electrode material, is performed subsequent to the patterning step, in which the through holes 54A and 54B are formed in the resist 53, so that the surface roughness of each of the surface roughness is significantly reduced.

Figure 4B:
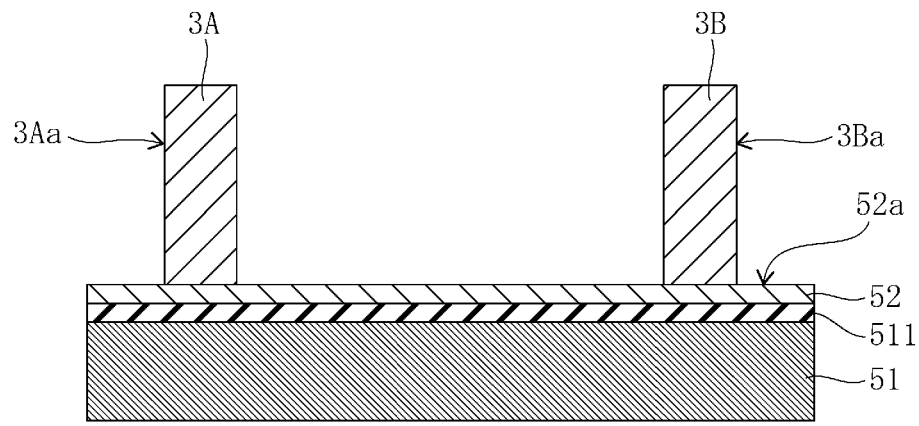

After the first-electrode forming step has been performed, the resist removing step is performed as illustrated in FIG. 4B. In this step, the resist 53 is removed from the surface 52a of the metal film 52. As a result, the surface 52a of the metal film 52 is exposed, and the through-via electrodes 3A and 3B are vertically formed on the surface 52a.

Figure 4C:
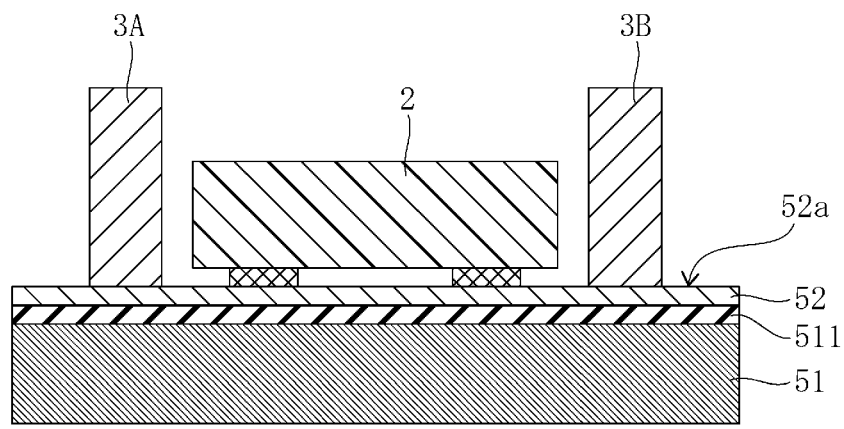

After the resist removing step has been performed, the component placement step is performed as illustrated in FIG. 4C. In this step, the electronic component 2 is disposed on the surface 52a of the metal film 52 by using a fixing material or the like. In this case, the electronic component 2 is disposed at a predetermined position due to the relationship with the positions of the through-via electrodes 3A and 3B. Positioning of the electronic component 2 to the predetermined position is able to be even more easily and precisely performed compared with the case where an electronic component is embedded in a resin substrate by a manufacturing method of the related art, and then the positions in the resin substrate at which through holes are to be formed are determined by taking into consideration the relationship with the position of the electronic component.

Figure 5A:
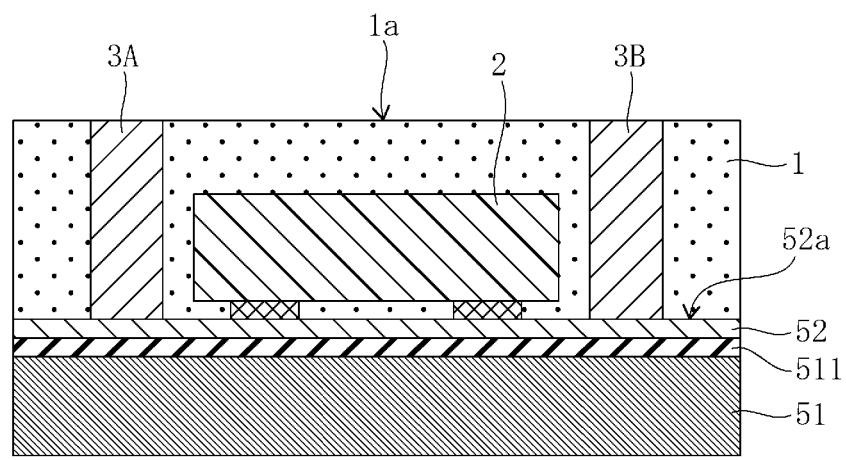
FIGS. 5A to 5C are diagrams sequentially illustrating, following FIG. 4C, steps that are performed when the component-embedded substrate is manufactured.

After the component placement step has been performed, the substrate forming step is performed as illustrated in FIG. 5A. In this step, the electronic component 2 is resin-sealed on the surface 52a of the metal film 52. As a result, the resin substrate 1 is formed on the surface 52a of the metal film 52. In this case, the resin substrate 1 is formed such that the electronic component 2 is embedded in the resin substrate 1 and such that end surfaces of the through-via electrodes 3A and 3B are exposed at a surface (a surface that is located on the side opposite to the side on which the metal film 52 is disposed and that is the first main surface 1a) of the resin substrate 1.

The resin that includes the filler is used to form the resin substrate 1. As a result, the coefficient of linear expansion of the resin substrate 1 is able to be made uniform or substantially uniform, which in turn results in an improvement of the reliability of the component-embedded substrate 101 that is manufactured. Note that, in the case where a sufficient reliability is able to be obtained without the filler, a resin that does not include a filler may be used to form the resin substrate 1.

Figure 5B:
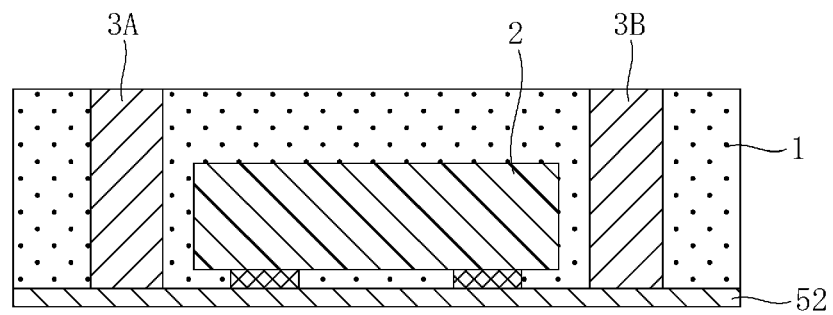

In the removing step, as illustrated in FIG. 5B, the support 51 is removed from the resin substrate 1 while the metal film 52 remains on the resin substrate 1. In other words, the support 51 and the metal film 52 are separated from each other at the adhesive member 511, such as a double-sided adhesive tape. By leaving the metal film 52 on the resin substrate 1 in this manner, static electricity that may be generated when the support 51 is removed from the resin substrate 1 is able to escape to the outside through the metal film 52. Therefore, the electronic component 2 is prevented from being damaged by electrostatic discharge in the removing step.

Figure 5C:
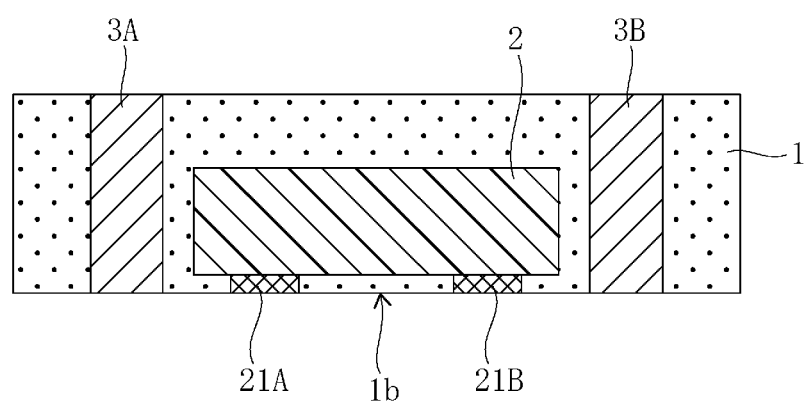

After the removing step has been performed, the conductor removing step is performed as illustrated in FIG. 5C. In this step, the metal film 52 is chemically removed from the resin substrate 1. As an example, the metal film 52 is removed by wet etching. By performing a chemical removal treatment in this manner, the metal film 52 is able to be removed without generating static electricity. Therefore, the electronic component 2 is prevented from being damaged by electrostatic discharge in the conductor removing step.

After the conductor removing step has been performed, the second-electrode forming step is performed (see FIG. 1). In this step, the wiring electrode 4A, which connects the terminal 21A of the electronic component 2 and the through-via electrode 3A to each other, and the wiring electrode 4B, which connects the terminal 21B of the electronic component 2 and the through-via electrode 3B to each other, are formed on the second main surface 1b (the surface that is located on the side on which the support 51 is disposed before the removing step is performed) of the resin substrate 1.

In the method of manufacturing the component-embedded substrate 101 according to the first preferred embodiment, by sealing the electronic component 2 with the resin that includes the filler having a diameter larger than the surface roughness of the side surface of the through-via electrode 3A (3B), the surface area of the filler with respect to the resin component included in the resin is smaller than that in the case where the diameter of the filler is small, and thus, the fluidity of the resin is improved, and the filling property of the resin is able to be improved.

In addition, even in the case where the electronic component 2 is sealed with the resin that includes the filler having a diameter larger than the surface roughness of the side surface of the through-via electrode 3A (3B), the first-electrode forming step is performed before the substrate forming step is performed, and thus, the large diameter of the filler included in the resin, which is used to form the resin substrate 1, does not have an adverse effect, so that the side surfaces 3Aa and 3Ba of the through-via electrodes 3A and 3B are smooth with less depressions and projections. In other words, in a component-embedded substrate that is manufactured by the method of manufacturing the component-embedded substrate 101 according to the first preferred embodiment, the parameter P1 (Rp), which represents the surface roughness of each of the side surfaces 3Aa and 3Ba, is smaller than the parameter P2, which represents the size of the diameter in the filler included in the resin used to form the resin substrate 1 (the largest diameter among the diameters of the filler particles included in the resin).

Figure 6:
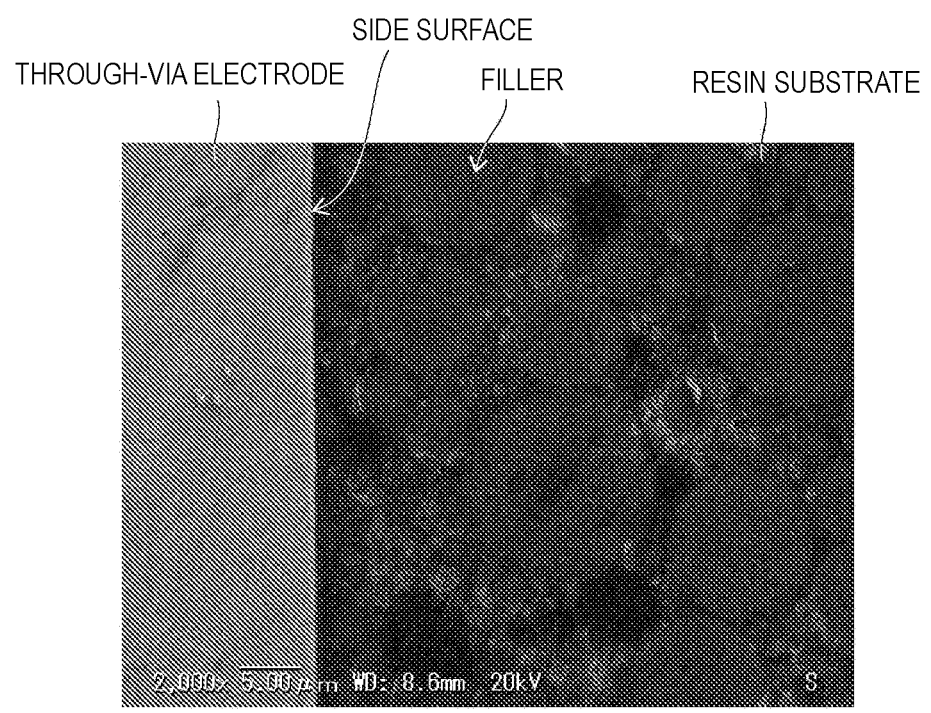
FIG. 6 is a cross-sectional photographic image illustrating a portion of a side surface of a through-via electrode in an actually manufactured component-embedded substrate.

FIG. 6 is a cross-sectional photographic image illustrating a portion of a side surface of a through-via electrode in the actually manufactured component-embedded substrate 101. It is seen from the cross-sectional photographic image that the size of each of the depressions and projections formed in and on the side surface is sufficiently smaller than the diameter of the filler. Therefore, it is understood that the side surfaces of the through-via electrodes are made smooth by the above-described manufacturing method.

Accordingly, in the component-embedded substrate 101 that is manufactured, the surface roughness of each of the side surfaces 3Aa and 3Ba of the through-via electrodes 3A and 3B is small. More specifically, the parameter P1 (Rp), which represents the surface roughness of each of the side surfaces 3Aa and 3Ba, is smaller than the parameter P2, which represents the size of the diameter in the filler included in the resin, out of which the resin substrate 1 is made (the largest diameter among the diameters of the filler particles included in the resin). Here, when a current in a high frequency range flows through the through-via electrode 3A, the current flows through a surface layer portion of the through-via electrode 3A including the side surface 3Aa of the through-via electrode 3A. In the case where the surface roughness of the side surface 3Aa is small as in the present preferred embodiment, the flow of the current in the through-via electrode 3A is not obstructed, and as a result, the resistance of the through-via electrode 3A is kept low. This is common to the through-via electrode 3B. Therefore, when the component-embedded substrate 101 is applied to a high-frequency module, the high-frequency module is able to obtain favorable frequency characteristics.

Note that the distance between the through-via electrode 3A (3B) and the electronic component may be larger than the sum of the surface roughness of the surface of the through-via electrode 3A (3B) that is in contact with the resin substrate 1 and the diameter of the filler. In this case, the resin is able to be further injected into the space between the through electrode 3A (3B) and the electronic component, and thus, the filling property of the resin is able to be further improved.

In addition, the distance between the through-via electrode 3A and the through-via electrode 3B may be larger than the sum of the surface roughness of the surface of the through-via electrode 3A that is in contact with the resin substrate 1, the surface roughness of the surface of the through-via electrode 3B that is in contact with the resin substrate 1, and the diameter of the filler. In this case, the resin is able to be further injected into the space between the through-via electrode 3A and the through-via electrode 3B, and thus, the filling property of the resin is able to be further improved.

As a second preferred embodiment of the present invention, in the above-described manufacturing method, the resist 53 may be directly formed onto the support 51 without using the metal film 52, or the resist 53 may be indirectly formed onto the support 51 with the adhesive member 511 interposed therebetween. In this case, in the first-electrode forming step, a method, such as electroless plating, that does not require the metal film 52 is used to fill the through holes 54A and 54B with the electrode material. In addition, in the removing step, the support 51 is removed from the resin substrate 1 in an environment in which static electricity is unlikely to be generated.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method of manufacturing a component-embedded substrate, the method comprising:
    a resist forming step of forming a patterning resist onto a support;
    a patterning step of forming a through hole extending through the resist by performing patterning on the resist;
    a first electrode forming step of forming a through-via electrode by filling the through hole with an electrode material;
    a resist removing step of removing the resist;
    a component placement step of placing an electronic component on the support;
    a substrate forming step of forming a resin substrate by sealing the electronic component with a resin that includes a filler with a diameter larger than a surface roughness of a side surface of the through-via electrode; and
    a removing step of removing the support from the resin substrate; wherein
    the first electrode forming step is performed before the substrate forming step is performed.

2. The method according to claim 1, wherein the resist forming step includes:
a step of causing the support to support a base conductor; and
a step of forming the resist onto the base conductor; wherein
in the patterning step, a surface of the base conductor is exposed by forming the through hole;
in the component placement step, the electronic component is disposed on the base conductor;
in the substrate forming step, the resin substrate is formed on the base conductor;
in the removing step, the base conductor remains on the resin substrate when the support is removed from the resin substrate; and
the method further includes a conductor removing step of removing the base conductor from the resin substrate after the removing step has been performed.

3. The method according to claim 2, wherein, in the conductor removing step, the base conductor is chemically removed from the resin substrate.

4. The method according to claim 1, wherein, in the substrate forming step, the electronic component is resin-sealed by using the resin including the filler.

5. The method according to claim 1, further comprising:
a second electrode forming step of forming, after the removing step has been performed, a wiring electrode that connects a terminal of the electronic component and the through-via electrode to each other onto a main surface of the resin substrate located on a side on which the support is disposed.

6. The method according to claim 1, wherein the diameter of the filler is a largest diameter among diameters of filler particles included in the resin.

7. The method according to claim 1, wherein a distance between the through electrode and the electronic component is larger than a sum of the surface roughness of the surface of the through-via electrode and the diameter of the filler.

8. The method according to claim 1, wherein
the through electrode includes a first through electrode and a second through electrode; and
a distance between the first through electrode and the second through electrode is larger than a sum of the surface roughness of a surface of the first through-via electrode, a surface roughness of a surface of the second through-via electrode in contact with the resin substrate, and the diameter of the filler.

9. A component-embedded substrate comprising:
a resin substrate made of a resin including a filler;
an electronic component that is embedded in the resin substrate;
a through-via electrode that extends through the resin substrate; and
a wiring electrode that is located on at least one of main surfaces of the resin substrate and that connects a terminal of the electronic component and the through-via electrode to each other; wherein
a surface roughness of a surface of the through-via electrode in contact with the resin substrate is smaller than a diameter of the filler.

10. The component-embedded substrate according to claim 9, wherein the surface roughness of the surface of the through-via electrode is Rp.

11. The component-embedded substrate according to claim 9, wherein the diameter of the filler is a largest diameter among diameters of filler particles included in the resin.

12. The component-embedded substrate according to claim 9, wherein a distance between the through electrode and the electronic component is larger than a sum of the surface roughness of the surface of the through-via electrode and the diameter of the filler.

13. The component-embedded substrate according to claim 9, wherein
the through electrode includes a first through electrode and a second through electrode; and
a distance between the first through electrode and the second through electrode is larger than a sum of the surface roughness of a surface of the first through-via electrode, a surface roughness of a surface of the second through-via electrode in contact with the resin substrate, and the diameter of the filler.

14. A high-frequency module comprising:
the component-embedded substrate according to claim 9; and
another electronic component that is mounted on the at least one of main surfaces of the resin substrate included in the component-embedded substrate and that is connected to the through-via electrode on the one main surface.

15. The high-frequency module according to claim 14, wherein the surface roughness of the surface of the through-via electrode is Rp.

16. The high-frequency module according to claim 14, wherein the diameter of the filler is a largest diameter among diameters of filler particles included in the resin.

17. The high-frequency module according to claim 14, wherein a distance between the through electrode and the electronic component is larger than a sum of the surface roughness of the surface of the through-via electrode and the diameter of the filler.

18. The high-frequency module according to claim 14, wherein
the through electrode includes a first through electrode and a second through electrode; and
a distance between the first through electrode and the second through electrode is larger than a sum of the surface roughness of a surface of the first through-via electrode, a surface roughness of a surface of the second through-via electrode in contact with the resin substrate, and the diameter of the filler.

* * * * *